United States Patent [19]

Kadota

[11] 4,276,524
[45] Jun. 30, 1981

[54] ACOUSTIC SURFACE WAVE DEVICE

[75] Inventor: Michio Kadota, Kyoto, Japan

[73] Assignee: Murata Manufacturing Co., Ltd., Nagaokakyo, Japan

[21] Appl. No.: 930,674

[22] Filed: Aug. 3, 1978

[30] Foreign Application Priority Data

Aug. 10, 1977 [JP] Japan .................... 52-96469

[51] Int. Cl.$^3$ .............. H03H 9/145; H03H 9/64
[52] U.S. Cl. ...................... 333/194; 333/193; 333/196
[58] Field of Search ................ 333/150–155, 333/193–196; 310/313; 331/107 A; 364/821; 330/5.5; 365/157

[56] References Cited

U.S. PATENT DOCUMENTS

| 3,801,937 | 4/1974 | Bristol | 333/196 |
| 4,160,219 | 7/1979 | Kuny | 333/194 X |

FOREIGN PATENT DOCUMENTS

| 2358054 | 5/1975 | Fed. Rep. of Germany . | |
| 2618210 | 10/1977 | Fed. Rep. of Germany . | |
| 130897 | 5/1977 | German Democratic Rep. | 333/153 |

OTHER PUBLICATIONS

Mitchell et al.–"Synthesis of Acoustic-Surface-Wave Filters Using Double Electrodes" in Electronics Letters 28 Nov. 74; p. 512.

Chao et al.–"Design Considerations for Nonsymmetrical Filters", 1975 Ultrasonic Symposium Proceedings, IEEE Cat. #CHO 994–4SU; pp. 331–333.

Primary Examiner—Marvin L. Nussbaum
Attorney, Agent, or Firm—Staas & Halsey

[57] ABSTRACT

An acoustic surface wave device comprises transducers including interdigital electrodes formed on the surface of a piezoelectric material substrate, wherein an electrical signal is converted into an acoustic surface wave and vice versa. A pair of interdigital electrodes are provided, one constituting an input transducer and the other constituting an output transducer. One of the input and output transducers is formed as a normal type of interdigital electrode. The other interdigital electrode has been apodized by changing overlapping lengths of the adjacent electrode fingers to get a desired pass characteristic. Most fingers of the other interdigital electrode are adapted to have the width of $\frac{3}{8}\lambda_0$ and disposed with the electrode pitch of $\frac{1}{2}\lambda_0$. The electrode fingers are disposed such that two fingers of different potentials are faced at the free ends and each facing free end is adapted to have a protruding electrode portion having the width of $\frac{1}{8}\lambda_0$.

17 Claims, 10 Drawing Figures

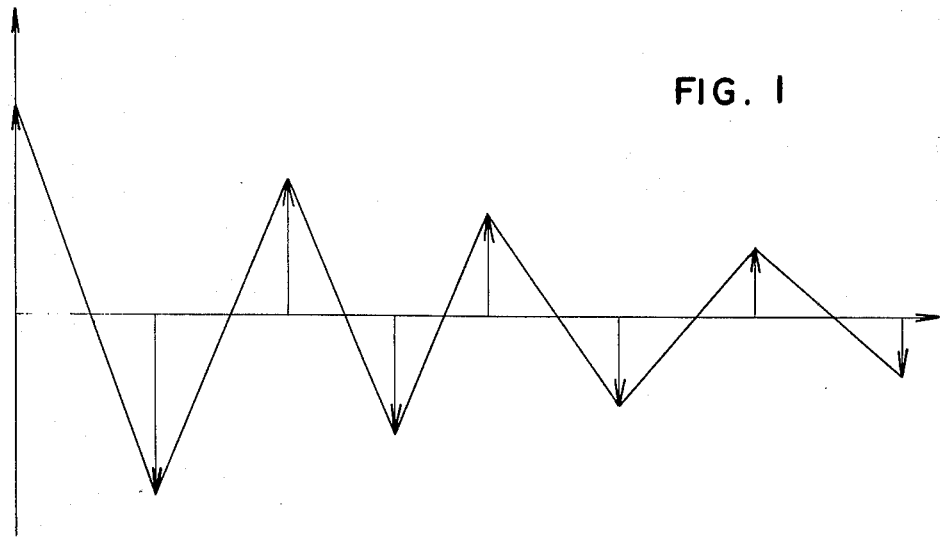
FIG. 1
FIG. 2
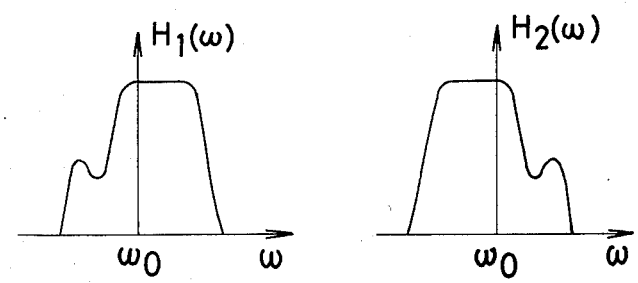
FIG. 3
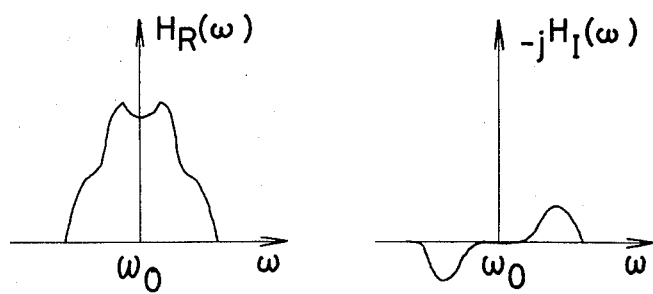

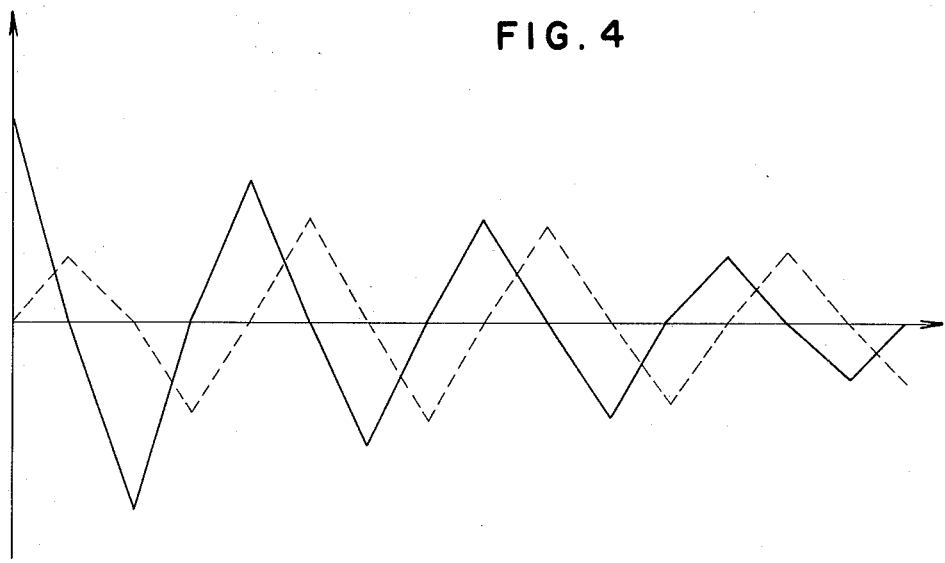
FIG. 4
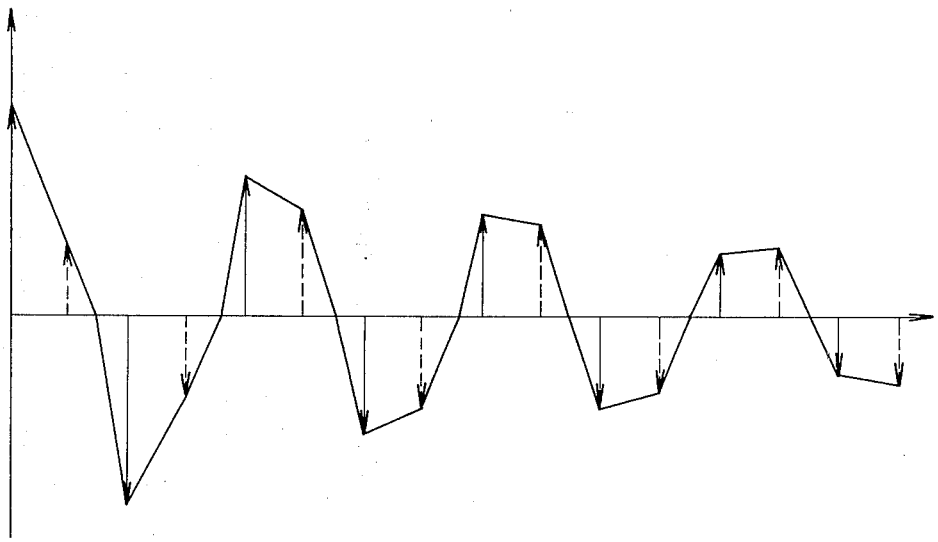
FIG. 5
$\frac{1}{4}\lambda_0$

ACOUSTIC SURFACE WAVE DEVICE

BACKGROUND OF THE INVENTION

1. Field of the Invention

The present invention relates to an acoustic surface wave device. More specifically, the present invention relates to an acoustic surface wave device having a non-symmetrical frequency characteristic with respect to the central frequency, for use in a video intermediate frequency circuit of a television receiver, for example.

2. Description of the Prior Art

A typical prior art acoustic surface wave device comprises a transducer including a piezoelectric material substrate of piezoelectric ceramic of such as PZT, a single crystal of such as $LiNbO_3$ or a piezoelectric thin film of such as $ZnO$ and a pair of interdigital electrodes are formed. Each of the interdigital electrodes comprises a comb shaped electrode, each comb shaped electrode comprising a plurality of electrode fingers and a common electrode for commonly connecting each of the electrode fingers at one end. The pair of comb shaped electrodes are disposed such that the plurality of electrode fingers of one comb shaped electrode are disposed in an interdigital manner with the plurality of electrode fingers of the other comb shaped electrode. One of the pair of the interdigital electrodes constitutes an input transducer and the other constitutes the output transducer. Because of the advantages that an acoustic surface wave device is small sized and requires no adjustment, an acoustic surface wave device has been utilized in various types of equipment. Of late, an acoustic surface wave device is also utilized as a filter in a video intermediate frequency circuit in television receivers. As is well known, a video intermediate frequency circuit of a television receiver must includes a sound trap. Thus, it is necessary to provide a filter having a frequency response that is non-symmetrical with respect to the central frequency, or the frequency $f_0$ or $\omega_0$ intermediate the picture signal frequency and the chroma signal frequency.

Conventionally, in order to achieve a non-symmetrical frequency response with respect to the central frequency in an acoustic surface wave device, a plurality of acoustic surface wave filters having different frequency responses have been used. However, utilization of a plurality of acoustic surface wave filters is not preferred because of an increased size of the apparatus. Of late, therefore, an attempt has been made to provide a single acoustic surface wave filter having a non-symmetrical frequency response. One approach is to change the distance between the centers of the two adjacent electrode fingers, i.e. the electrode pitch, in the propagating direction of the acoustic wave. Such type of acoustic surface wave filter may be referred to as a varying pitch type. More specifically, when a non-symmetrical frequency characteristic required for a video intermediate frequency filter, for example, is subjected to Fourier reverse conversion, then an impulse response as shown in FIG. 1 is obtained. The impulse response thus obtained includes an imaginary part as a result of Fourier reverse conversion. It is known that by forming the pattern of one of the input or output interdigital electrodes in association with the impulse response thus obtained, a desired frequency characteristic can be achieved in the acoustic surface wave device. More specifically, the electrode pitch is selected to be proportional to the period between the adjacent peak points in the impulse response as shown in FIG. 1 and the overlapping length of the adjacent electrode fingers, i.e. the acoustic surface wave exciting region, is selected to be proportional to the amplitude of the respective peak point in the impulse response as shown in FIG. 1. The acoustic surface wave filter thus obtained includes the interdigital electrodes of non-uniform electrode pitch, because of non-uniformity of the time period between the respective peak points where the imaginary part becomes zero, as seen from FIG. 1, and thus is of a so-called varying pitch type. Although such conventional approach achieves a desired characteristic in terms of the frequency response, non-uniformity of the electrode pitch and a possible extremely small electrode pitch for some electrode fingers make it difficult to design the electrode pattern and also makes it difficult to correctly form the electrode pattern through a photoetching process or the like and degrades the efficiency of manufacturing process.

In order to solve the above described disadvantage, therefore, different approaches have been proposed to achieve a non-symmetrical frequency characteristic using the interdigital electrodes of the equal pitch. One approach is an odd/even function method and the other is a mirror method.

The odd/even function method is described in detail, for example, in 1975 Ultrasocics Symposium Proceedings, IEEE Cat. #75 CHO 994-4SU "DESIGN CONSIDERATIONS FOR NONSYMMETRICAL SAW FILTERS". Now the odd/even function method will be briefly described. According to the odd/even function method, assuming the representation of a desired frequency characteristic to be $H_1(\omega)$, $H_2(\omega)$ then $H_1(\omega-\omega_0)=H_2(\omega_0-\omega)$. The relation between $H_1(\omega)$ and $H_2(\omega)$ is shown in FIG. 2. Assuming the even component, i.e. the symmetrical component to be $H_R(\omega)$, the odd component, i.e. the non-symmetrical component to be $H_I(\omega)$ and assuming further that $H_R(\omega)$ and $H_I(\omega)$ are defined by the following equations (1) and (2), then the relation of these is shown in FIG. 3.

$$H_R(\omega) = \frac{H_1(\omega) + H_2(\omega)}{2} \quad (1)$$

$$H_I(\omega) = \frac{H_2(\omega) - H_1(\omega)}{2j} \quad (2)$$

From the above described equations (1) and (2), $H_I(\omega)$ is expressed by the following equation (3).

$$H_1(\omega) = H_R(\omega) - jH_I(\omega) \quad (3)$$

The impulse response of $H_1(\omega)$ is a Fourier conversion of the above described equation (3) and is expressed by the following equation (4).

$$h(t) = h_R(t) - jh_I(t) \quad (4)$$
$$= \int H_R(\omega)e^{j2\pi ft}df + \int -jH_I(\omega)e^{j2\pi ft}df$$

The impulse responses shown by $h_R(t)$ and $-jh_I(t)$ in the above described equation (4) are shown by the solid line and the dotted line, respectively, in FIG. 4. As seen from FIG. 4, these two impulse response characteristic curves indicate that the time interval between the respective peak points is $1/2f_0$ or $\frac{1}{2}\lambda_0$ in terms of the wave length and is uniform. These two impulse response characteristic curves further indicate that the respective peak points of two impulse response characteristic curves are positioned intermediate the peak points of the opponent curve. It is pointed out that the impulse response curve shown by the solid line is of the symmetrical component or the even component and the impulse response curve shown by the dotted line is of the non-symmetrical component or the odd component.

By composing the impulse response characteristic curves shown in FIG. 4, a new impulse response characteristic as shown in FIG. 5 is obtained, which represents h(t) shown in the above described equation (4), which is an impulse response of the desired frequency characteristic $H_1(\omega)$. Referring to FIG. 5, it is understood that electrode fingers should be disposed at the interval of $1/4f_0(\frac{1}{4}\lambda_0)$, i.e. at the position corresponding to the respective peak points shown in FIG. 4, while the lengths of the electrode fingers are selected such that the overlapping lengths of the adjacent electrode fingers that are overlapped with each other are proportional to the amplitudes of the respective points shown in FIG. 5. The interdigital electrode thus obtained is shown in FIG. 6. As seen from FIG. 6, the electrode pitch is selected to be a constant value of $\frac{1}{4}\lambda_0$ and the overlapping lengths of the adjacent electrode fingers that are overlapped with each other are selected to be proportional to the amplitude shown in FIG. 5. It has been observed that the frequency characteristic of the filter thus obtained by employing the interdigital electrode shown in FIG. 6 achieves the desired characteristic, i.e. $H_1(\omega)$ shown in FIG. 2. It is pointed out that in the FIG. 6 example the width of the respective electrode fingers 11 to 15, . . . and 21 to 26, . . . of a pair of comb shaped electrodes 10 and 20 is selected to be the same as the electrode spacing and both the width and the electrode spacing have been selected to be $\frac{1}{8}\lambda_0$ for the reason that such is most preferred from the standpoint of designing. These electrode fingers 11 to 15 are coupled to a common electrode 10a at one end of each of them, whereby these electrode fingers are maintained in the same potential as that of the electrode 10a, while the electrode fingers 21 to 26 are coupled to a common electrode 20a at one end of each of them, whereby these electrode fingers are maintained in the same potential as that of the electrode 20a.

The mirror method is described in detail, for example, in ELECTRONICS LETTERS 28th Nov. 1974, Vol. 10 No. 24 "SYNTHESIS OF ACOUSTIC-SURFACE-WAVE-FILTERS USING DOUBLE ELECTRODES" and U.S. Pat. No. 3,968,461, issued July 6, 1976 to Richard Frank Mitchel et al. Briefly described, according to the mirror method, assuming that the central frequency of a desired frequency characteristic to be $f_0$, an image of the central frequency of $3f_0$ which is line symmetrical with respect to the frequency $2f_0$ is considered and an impulse response thus achieved is similar to that in the case of the above described odd/even function method. Accordingly, the electrode pattern of the interdigital electrode is similar to that shown in FIG. 6.

However, the interdigital electrode achieved by such conventional odd/even function method or mirror method still involves a further problem to be described in the following. Described with reference to FIG. 6, with the interdigital electrode shown in FIG. 6, the symmetrical component is excited or received by the electrode fingers 11 and 21, 22 and 12, 13 and 23, 24 and 14, 15 and 25, and so on, while the non-symmetrical component is excited or received by the electrode fingers 11 and 22, 22 and 13, 13 and 24, 24 and 15, 15 and 26, and so on. In other words, the electrode pitch of the electrode fingers for exciting or receiving the non-symmetrical component is $\frac{1}{2}\lambda_0$, while the electrode pitch of the electrode fingers for exciting or receiving the symmetrical component is $\frac{1}{4}\lambda_0$. Accordingly, the length of the portion of the electrode fingers, say the electrode finger 22, for exciting or receiving the non-symmetrical component interacting with the electrode finger 11 must be selected approximately two times that in the case of excitation with the original electrode pitch of $\frac{1}{4}\lambda_0$. Accordingly, according to the conventional electrode pattern as shown in FIG. 6, the total length of the electrode fingers in the length direction, i.e. in the direction orthogonal to the propagating direction of the acoustic surface wave, is still long. Another problem is that since only the non-symmetrical component is excited or received with the electrode pitch of $\frac{1}{2}\lambda_0$ a difference in the propagation velocity of the acoustic surface wave is caused between the symmetrical component and the non-symmetrical component and thus a phase difference is caused at the output between the symmetrical component and the non-symmetrical component, with the result of an unfavorable effect on the frequency characteristic. Thus, these problems become obstacles in embodying the above described odd/even function method and mirror method. Considering these methods from the standpoint of fabrication of a filter, the width of the electrode fingers is $\frac{1}{8}\lambda_0$ in the case of the electrode patterns shown in FIG. 6, and, therefore, assuming that the central frequency $f_0$ is 56.5 MHz, for example, then the actual width of the electrode fingers is about 5 $\mu$m, which is too thin to fabricate the electrode fingers in accordance with the current technology. Therefore, a further problem is encountered that the electrode fingers are liable to be broken in an etching process and in further processes in fabricating the filter.

SUMMARY OF THE INVENTION

Briefly described, the present invention also employs the odd/even function method or the mirror method to achieve an impulse response characteristic. Thus, the electrode pattern is obtained in accordance with the impulse response characteristic. According to the present invention, however, a protruding portion is formed at the free end of each of the main electrode for exciting the symmetrical component. Preferably, an auxiliary electrode is formed such that the free end of the auxiliary electrode faces the free end of the main electrode. Preferably, a protruding portion is formed at the free end of the auxiliary electrode such that the protruding portion of the auxiliary electrode is faced to the protruding portion of the main electrode.

According to the present invention, an acoustic surface wave device having a non-symmetrical frequency characteristic with respect to the central frequency is provided, by employing an interdigital electrode pattern having an equispaced electrode pitch and a smaller length in the direction orthogonal to the propagating direction of the acoustic surface wave. According to the present invention, the frequency characteristic achieved by the acoustic surface wave device is very close to the theoretical characteristic, i.e. of characteristic obtained through calculation, with the result that excellent reproducibility is achieved. In addition, most electrode fingers are wider in width such as $\frac{3}{8}\lambda_0$, $\frac{5}{8}\lambda_0$ and the like, as compared with the above described prior art. Therefore, there is much less fear that the electrode fingers are broken through an etching process and the like in fabricating the acoustic surface wave device.

Therefore, a principal object of the present invention is to provide an acoustic surface wave device having an improved electrode pattern.

Another object of the present invention is to provide an acoustic surface wave device having an interdigital electrode of an equispaced electrode pitch which is easy of designing of the electrode pattern.

A further object of the present invention is to provide an acoustic surface wave device that can be made small-sized.

Still a further object of the present invention is to provide an acoustic surface wave device of excellent reproducibility.

Another object of the present invention is to provide an acoustic surface wave device of a good yield in fabrication.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 1 shows an impulse response characteristic of a conventional interdigital electrode of a varying electrode pitch;

FIG. 2 shows frequency characteristics $H_1(\omega)$ and $H_2(\omega)$ for use in explanation of the background of the present inventions and the present invention;

FIG. 3 shows the frequency characteristics of the symmetrical component $H_R(\omega)$ and the non-symmetrical component $-jH_I(\omega)$ of the frequency characteristic $H_1(\omega)$;

FIG. 4 shows an impulse response characteristic of $H_R(\omega)$ and $-jH_I(\omega)$, wherein the solid line shows $H_R(\omega)$ and the dotted line shows $-jH_I(\omega)$;

FIG. 5 shows an impulse response characteristic of a composition of $H_R(\omega)$ and $-jH_I(\omega)$;

DESCRIPTION OF THE PREFERRED EMBODIMENTS

The present invention also utilizes the impulse response characteristic curve shown in FIG. 5 referred to in the description of the prior art in determining the electrode pattern. Since the impulse response characteristic shown in FIG. 5 was fully described previously with simultaneous reference to FIGS. 2 to 4, it is not believed necessary to describe the same again.

Figure 7A:
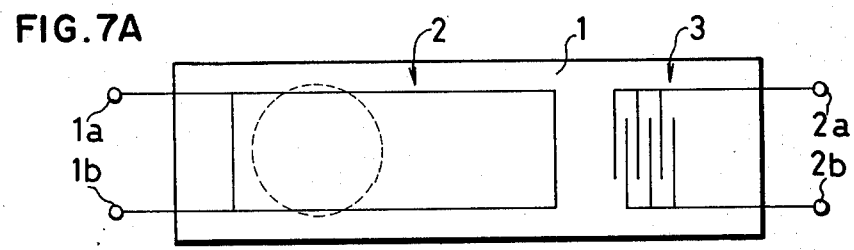
FIG. 7A is a schematic view of one embodiment of an acoustic surface wave filter in accordance with the present invention.
Figure 7B:
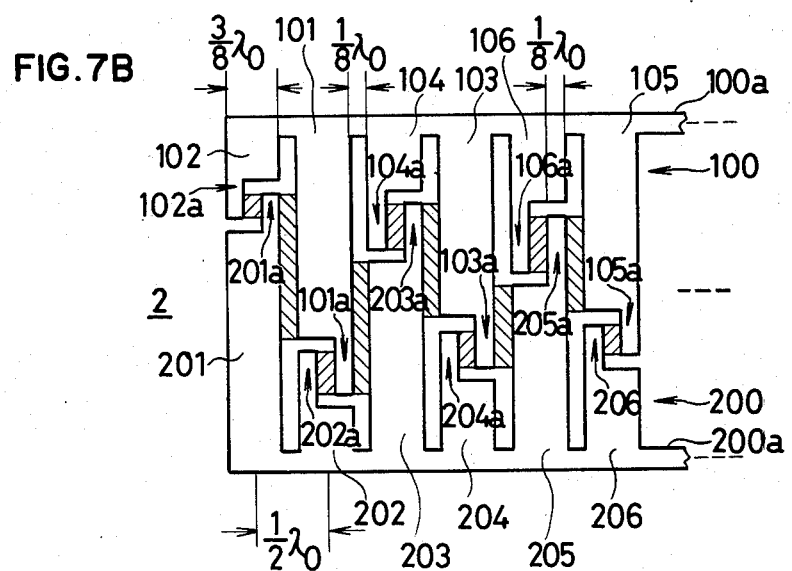
FIG. 7B shows an enlarged view of a portion encircled with the dotted line in FIG. 7A, showing an example of the pattern of the interdigital electrode in accordance with the present invention.

FIG. 7A shows a schematic diagram of one embodiment of the present invention. As seen in FIG. 7A, an acoustic surface wave device comprises a piezoelectric material substrate 1 of ceramic such as PZT, or a single crystal of such as LiNbO$_3$ or a piezoelectric thin film of such as ZnO. The device further comprises an interdigital electrode 2 constituting an input transducer and an interdigital electrode 3 constituting an output transducer both formed directly or through an insulating thin film on the piezoelectric material substrate 1. The interdigital electrode is responsive to an input signal applied between the input terminals 1a and 1b to excite an acoustic surface wave. The interdigital electrode 3 receives the acoustic surface wave excited by the interdigital electrode 2 and propagated along the surface of the piezoelectric material substrate 1 to provide an output signal between the output terminals 2a and 2b. It is pointed out that the FIG. 7A embodiment employs a well known normal type electrode pattern in the output side interdigital electrode 3. An essential feature of the present invention resides in the structure of the input side interdigital electrode 2. A detailed shape and electrode pattern of the interdigital electrode 2 is shown in FIG. 7B. It is pointed out, however, that the electrode patterns of the input side and output side interdigital electrodes 2 and 3 may be reversed, such that the input side interdigital electrode is of a normal type while the output side interdigital electrode is of a non-symmetrical frequency characteristic.

FIG. 7B shows in detail the input side interdigital electrode 2 practicing the present invention. The interdigital electrode 2 comprises a pair of comb shaped electrodes 100 and 200. The comb shaped electrodes 100 and 200 each comprise common electrodes 100a and 200a. It is pointed out that the electrode pattern shown in FIG. 7B is selected in accordance with the impulse response characteristic curve shown in FIG. 5. One comb shaped electrode 100 comprises main electrodes 101, 103, 105, . . . and auxiliary electrodes 102, 104, 106, . . . coupled to the common electrode 100a at one end of each of them. The main electrodes and auxiliary electrodes are disposed alternately with the electrode pitch of $\frac{1}{2}\lambda_0$ and the free end portions of the main electrodes and the auxiliary electrodes are adapted to be faced to the free end portions of the auxiliary electrodes and the main electrodes of a different potential. The main electrode fingers and the auxiliary electrode fingers each have the electrode width of $\frac{1}{8}\lambda_0$ and the free end portion of each of them is formed of a protruding electrode having the electrode width of $\frac{1}{8}\lambda_0$ so as to be protruded from the free end portion. Referring to FIG. 7B, the protruding electrodes are denoted by the same reference characters as that of the electrode fingers but followed by the subscript "a". Each protruding electrode formed to be protruded from each electrode finger is adapted to be overlapped, in the length direction, with the protruding electrode formed to be protruded from the free end of the adjacent opponent electrode finger. For example, the auxiliary electrode 102 is opposed to the main electrode 201, wherein the free end portions thereof are faced to each other. The protruding electrode 102a of the auxiliary electrode 102 is overlapped with the protruding electrode 201a of the main electrode 201. It is pointed out that the spacing between the respective adjacent electrode fingers is selected to be $\frac{1}{8}\lambda_0$ from the standpoint of designing.

Referring to FIG. 7B, the overlapping length of two adjacent main electrode fingers, for example the main electrode fingers 201 and 101, as shown as hatched right downward in the figure, is selected to correspond to the magnitude of the arrow mark of the solid line in the impulse response characteristic curve shown in FIG. 5. On the other hand the overlapping length of the adjacent protruding electrodes formed from the free end portions of the above described electrode fingers, for example the protruding electrodes 102a and 201a, as shown as hatched left downward in the figure, is selected to correspond to the magnitude of the arrow mark of the dotted line in the impulse response characteristic curve shown in FIG. 5. The first acoustic surface wave component, i.e. the symmetrical component is excited or received in the region as hatched right downward. On the other hand, the second acoustic surface wave component, i.e. the non-symmetrical component is excited or received in the region as left downward hatched.

Figure 8A:
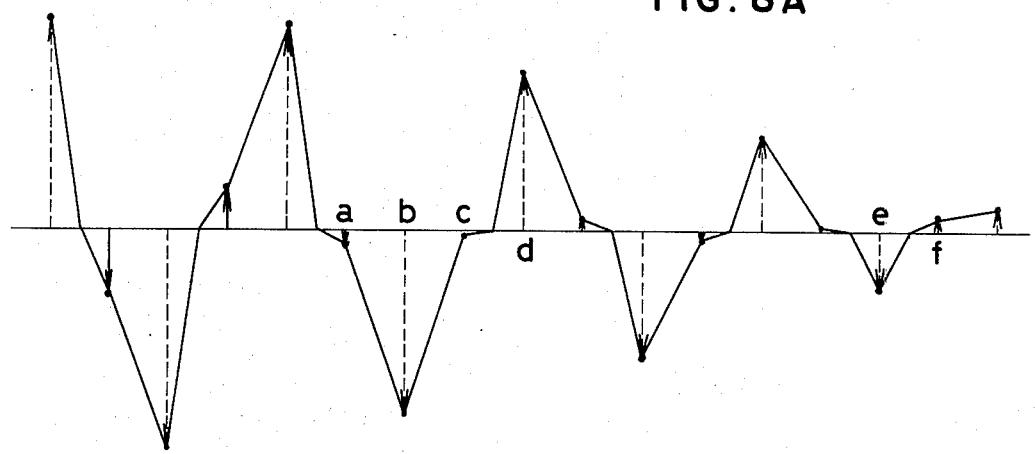
FIG. 8A shows an impulse response characteristic for explaining another example of electrode pattern in accordance with the present invention.
Figure 8B:
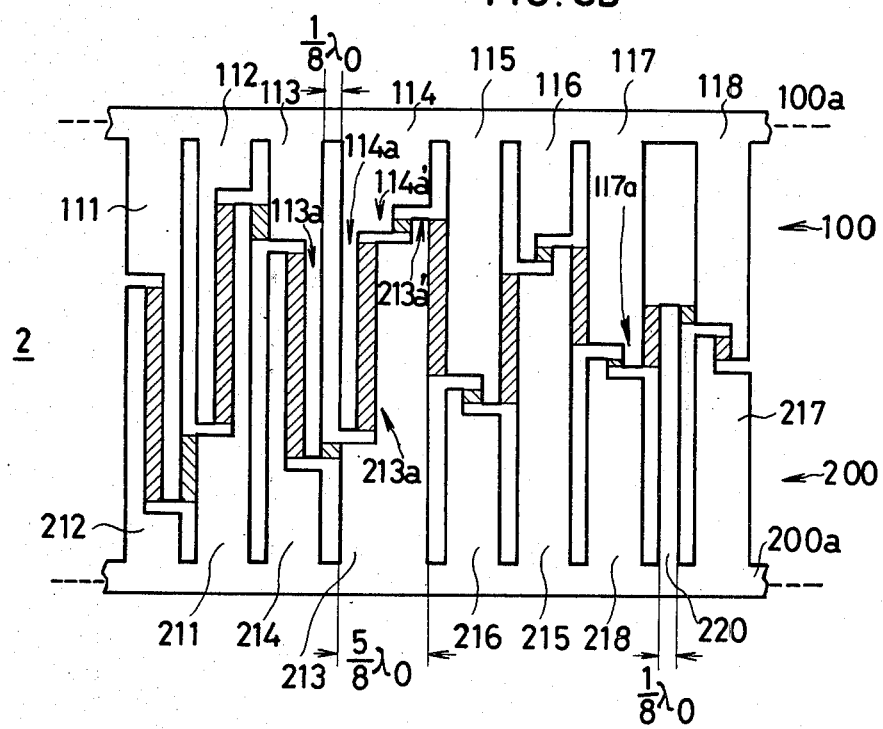
FIG. 8B shows the electrode pattern in accordance with the FIG. 8A impulse response characteristic.

FIG. 8A shows an impulse response characteristic curve for explaining another example of the electrode pattern in accordance with the present invention and FIG. 8B shows an interdigital electrode 2 achieved in accordance with the impulse response characteristic shown in FIG. 8A. The embodiment shown in FIGS. 8A and 8B is different from that shown in FIGS. 5 and 7B, and FIGS. 8A and 8B show the portion or region more spaced from the center of the impulse response characteristic. Although the length of the electrode fingers shown in FIG. 8B is shown longer than that of the FIG. 7B embodiment, it is only for facility of illustration. It is pointed out that the total length of the electrode fingers in the direction orthogonal to the propagating direction of the acoustic surface wave is the same as that of the FIG. 7B embodiment. However, the FIG. 8B embodiment is different from the FIG. 7B embodiment in that the non-symmetrical component is of a larger amplitude as compared with that of the symmetrical component. Similarly to the FIG. 7B embodiment, the symmetrical component is excited or received at the region as hatched right downward and the non-symmetrical component is excited or received at the region as hatched left downward.

It should be particularly noted that in the FIG. 8B embodiment the main electrode finger 213 and the auxiliary electrode finger 114 of a different potential opposing to the main electrode finger 213 have been differently designed. The main electrode finger 213 and the auxiliary electrode finger 114 are shaped to be wider in width by $(2/8)\lambda_0$ than other electrodes, so that these fingers are as wide as $\frac{3}{8}\lambda_0$ for the widest ones, because the three components a, b and c (see FIG. 8A) are consecutive in the negative side of the corresponding impulse response characteristic. In addition, the main electrode finger 213 and the auxiliary electrode finger 114 each have two protruding portions 213a and 213a' and 114a and 114a', respectively, protruding from the respective free ends. The component a shown in FIG. 8A is excited or received at the overlapping portion where the wide width portion of the main electrode finger 213 and the protruding portion 113 of the main electrode finger 113 are overlapped. Similarly, the component b is excited or received at the overlapping portion where the protruding portion 213a of the main electrode finger 213 and the protruding portion 114a of the auxiliary electrode finger 114 are overlapped. The component c is excited or received at the overlapping portion where the protruding portion 213a' of the main electrode finger 213 and the protruding portion 114a' of the auxiliary electrode finger 114 are overlapped. The component d is excited or received at the overlapping portion where the protruding portion 213a' of the main electrode finger 213 and the wide width portion of the main electrode finger 115 are overlapped. An auxiliary electrode finger 220 should also be noted in the FIG. 8B embodiment. Since the auxiliary electrode finger 220 is only the component e in the negative side of the corresponding impulse response characteristic, the auxiliary electrode finger 220 does not have a protruding electrode and is shaped to be as wide as $\frac{1}{8}\lambda_0$. In addition, there is no electrode finger disposed in a positional relation to be opposed to the auxiliary electrode finger 220. The component e is excited or received at the overlapping portion where the auxiliary electrode finger 220 and the protruding portion 117a of the main electrode finger 117 are overlapped, and the component f is excited or received at the overlapping portion where the auxiliary electrode finger 220 and the wide width portion of the auxiliary electrode finger 118 are overlapped.

Figure 6:
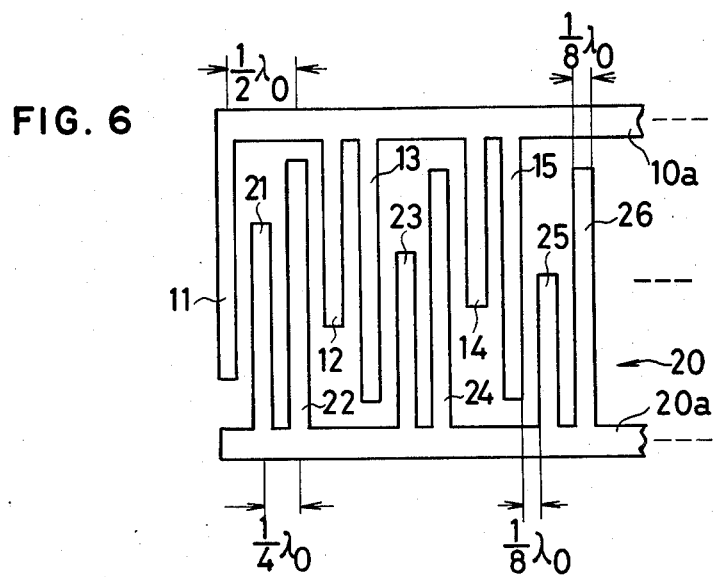
FIG. 6 shows an example of an electrode pattern of an interdigital electrode for use in a conventional acoustic surface filter which is of interest to the present invention.

As described in the foregoing, according to the present invention, most of the electrode fingers of the interdigital electrode constituting an acoustic surface wave device are shaped to be of the width of $\frac{1}{8}\lambda_0$ and are disposed with the electrode pitch of $\frac{1}{4}\lambda_0$. Accordingly, any fear is eliminated that the electrode fingers are broken during an etching process or further processes. In some cases, although very seldom, the width of the electrode finger must be $\frac{1}{4}\lambda_0$ or $\frac{3}{8}\lambda_0$ depending on the impulse response characteristic. As seen from FIGS. 7B and 8B, according to the present invention both the symmetrical component and the non-symmetrical component of the acoustic surface wave are excited or received with the electrode pitch of $\frac{1}{4}\lambda_0$, although with a conventional device as shown in FIG. 6 the symmetrical component was excited or received with the electrode pitch of $\frac{1}{2}\lambda_0$ and the non-symmetrical component was excited or received with the electrode pitch of $\frac{1}{4}\lambda_0$. Therefore, according to the present invention, the total length of the inventive acoustic surface wave device in the direction orthogonal to the propagating direction of the acoustic surface wave can be made small, as compared with the prior art device. In addition, according to the present invention, a phase difference at the output side can be eliminated.

In practicing the present invention, the protruding electrode at the side of the auxiliary electrode finger out of a pair of protruding electrodes having the electrode width of $\frac{1}{8}\lambda_0$ of the opposing electrode fingers may be dispensed with, such that the non-symmetrical component is excited or received between the protruding electrode of the main electrode finger and the main electrode finger of the different potential adjacent to the said main electrode finger. However, in this case, the above described advantage that the total length of the device in the direction orthogonal to the propagating direction of the acoustic surface wave can be made small cannot be achieved.

Although the present invention has been described and illustrated in detail, it is clearly understood that the same is by way of illustration and example only and is not to be taken by way of limitation, the spirit and scope of the present invention being limited only by the terms and the appended claims.

What is claimed is:

1. An acoustic surface wave device, comprising:
   a piezoelectric material adapted for propagating an acoustic surface wave,
   at least one electromechanical transducer coupled to a surface of said piezoelectric material at a transducer region thereof, said transducer comprising an interdigital electrode including a pair of comb shaped electrodes, disposed in an interdigital manner, each comb shaped electrode including a common electrode and a plurality of electrode fingers commonly connected to said common electrode, whereby an electrical signal is converted into an acoustic surface wave and an acoustic surface wave is converted into an electrical signal, at least one of said plurality of electrode fingers including a first portion having a given length connected to said common electrode at one end thereof, a second portion extending longitudinally from the other end of said first portion having a width narrower then that of said first portion, and a protruding portion extending longitudinally from said second portion, said protruding portion having a width narrower then that of said second portion.

2. An acoustic surface wave device in accordance with claim 1, wherein the width of said first portion of at least one of said electrode fingers is $\frac{3}{8}\lambda_0$, where $\lambda_0$ is the wave length of said central frequency.

3. An acoustic surface wave device in accordance with claim 1, wherein said plurality of electrode fingers are comprised of main electrode fingers and auxiliary electrode fingers.

4. An acoustic surface wave device in accordance with claim 3, wherein each said comb shaped electrode comprises a plurality of said auxiliary electrode fingers disposed between said main electrode fingers and commonly connected to said common electrode at one end thereof.

5. An acoustic surface wave device, comprising:

a piezoelectric material adapted for propagating an acoustic surface wave;

at least one electro mechanical transducer coupled to a surface of said piezoelectric material at a transducer region thereof, said transducer comprising an interdigital electrode including a pair of comb shaped electrodes, disposed in an interdigital manner, each comb shaped electrode including a common electrode and a plurality of main electrode fingers commonly connected to said common electrode, whereby an electrical signal is converted into an acoustic surface wave and vice versa;

at least one of said main electrode fingers including a portion of a wide width having a given length commonly connected to said common electrode at one end; and a protruding portion having a narrow width protruding in the length direction from the other end of said wide width portion, wherein at least half of said main electrode fingers are disposed with a pitch $\frac{1}{2}\lambda_0$, where $\lambda_0$ is the wavelength of a central frequency, and the width of the wide width portion of said main electrode finger is selected to be equal to the difference between $\frac{1}{2}\lambda_0$ and the distance between two adjacent interdigitally disposed main electrode fingers.

6. An acoustic surface wave device in accordance with claim 5, wherein said distance is $\frac{1}{8}\lambda_0$.

7. An acoustic surface wave device in accordance with claim 6, wherein the width of the narrow width protruding portion of said main electrode finger is $\frac{1}{8}\lambda_0$.

8. An acoustic surface wave device, comprising:

a piezoelectric material adapted for propagating an acoustic surface wave;

at least one electro mechanical transducer coupled to a surface of said piezoelectric material in a transducer region thereof, said transducer comprising an interdigital electrode including a pair of comb shaped electrodes, disposed in an interdigital manner, each comb shaped electrode including a common electrode and a plurality of main electrode fingers commonly connected to said common electrode, whereby an electrical signal is converted into an acoustic surface wave and vice versa;

at least one of said main electrode fingers including a portion of a wide width having a given length commonly connected to said common electrode at one end; and a protruding portion having a narrow width protruding in the length direction from the other end of said wide width portion, wherein at least one of said main electrode fingers is disposed with a pitch broader than $\frac{1}{2}\lambda_0$, and the width of the wide width portion of at least one of the main electrode fingers is $\frac{3}{8}\lambda_0$.

9. An acoustic surface wave device, comprising:

a piezoelectric material adapted for propagating an acoustic surface wave;

at least one electromechanical transducer for converting an electrical signal into a mechanical signal coupled to a surface of said piezoelectric material at a transducer region thereof, said transducer comprising an interdigital electrode including a pair of comb shaped electrodes, disposed in an interdigital manner, each comb shaped electrode including a common electrode and a plurality of main electrode fingers commonly connected to said common electrode, whereby an electrical signal is converted into an acoustic surface wave and vice versa;

at least one of said main electrode fingers including a portion of a wide width having a given length commonly connected to said common electrode at one end; and a protruding portion having a narrow width protruding in the length direction from the other end of said wide width portion;

wherein said wide width portion and said protruding portion, of said at least one of said main electrode fingers of one of said pair of comb shaped electrodes, each overlap one of said main electrode fingers of the other of said pair of comb shaped electrodes, wherein said each comb shaped electode comprises a plurality of auxiliary electrode fingers disposed between said main electrode fingers and commonly connected to said common electrode at one end thereof, wherein each of said plurality of main electrode fingers and each of said plurality of auxiliary electrode fingers has one free end which is not commonly connected to said common electrode, wherein said pair of comb shaped electrodes are disposed such that the free ends of the auxiliary electrode fingers of one comb shaped electrode are opposed to the free ends of the main electrode fingers of the opposing comb shaped electrode, and wherein a portion of the free ends of said plurality of auxiliary electrode fingers overlap a portion of the free ends of the opposed main electrode fingers whereby a non-symmetrical component of a surface acoustic wave is excited.

10. An acoustic surface wave device in accordance with claim 9, wherein each said auxiliary electrode finger comprises a wide width portion of a given length commonly connected at one end to said common electrode, and a narrow width protruding portion protruding in the length direction from the other end of said wide width portion.

11. An acoustic surface wave device in accordance with claim 10, wherein at least half of said auxiliary electrode fingers are disposed with a pitch of $\frac{1}{2}\lambda_0$, where $\lambda_0$ is the wave length of a central frequency, and the width of the wide width portion of said auxiliary electrode finger is selected to be equal to the difference between $\frac{1}{2}\lambda_0$ and the distance between any two adjacent interdigitally disposed fingers.

12. An acoustic surface wave device in accordance with claim 11, wherein said distance is $\frac{1}{8}\lambda_0$.

13. An acoustic surface wave device in accordance with claim 12, wherein the width of the narrow width protruding portion of said auxiliary electrode finger is $\frac{1}{8}\lambda_0$.

14. An acoustic surface wave device in accordance with claim 10, wherein said main electrode fingers and said auxiliary electrode fingers are disposed with a pitch smaller than $\frac{1}{2}\lambda_0$, and the width of at least one of said main electrode fingers and said auxiliary electrode fingers is selected to be $\frac{1}{8}\lambda_0$.

15. An acoustic surface wave device in accordance with claim 10, wherein at least half of said main electrode fingers are disposed with a pitch $\frac{1}{2}\lambda_0$, wherein $\lambda_0$ is the wave length of the central frequency, and the width of the wide width portion of said main electrode finger is selected to be equal to the difference between $\frac{1}{2}\lambda_0$ and the distance between any two adjacent interdigitally disposed electrode fingers.

16. An acoustic surface wave device in accordance with claim 15, wherein said electrode spacing is $\frac{1}{8}\lambda_0$.

17. An acoustic surface wave device in accordance with claim 16, wherein the width of the narrow width protruding portion of said main electrode finger is $\frac{1}{8}\lambda_0$.

* * * * *

UNITED STATES PATENT AND TRADEMARK OFFICE
CERTIFICATE OF CORRECTION

PATENT NO. : 4,276,524
DATED : June 30, 1981
INVENTOR(S) : MICHIO KADOTA

It is certified that error appears in the above—identified patent and that said Letters Patent is hereby corrected as shown below:

Col. 1, line 36, "includes" should be --include--.

Col. 2, line 45, "$H_1( ) =$" should be --$H_I( ) =$--;
line 49, "$H_I^1( )$" should be --$H_1( )$--.

Col. 7, line 47 "(2/8)" should be --2/8--;
line 58, "113" should be --113a--.

Col. 12, line 19, "electrode spacing" should be --distance--.

Signed and Sealed this

First Day of December 1981

[SEAL]

Attest:

Attesting Officer

GERALD J. MOSSINGHOFF

Commissioner of Patents and Trademarks